(12) United States Patent
Kuraoka et al.

(10) Patent No.: US 10,030,318 B2
(45) Date of Patent: Jul. 24, 2018

(54) COMPOSITE SUBSTRATE, METHOD FOR FABRICATING SAME, FUNCTION ELEMENT, AND SEED CRYSTAL SUBSTRATE

(71) Applicant: NGK INSULATORS, LTD., Aichi-prefecture (JP)

(72) Inventors: Yoshitaka Kuraoka, Okazaki (JP); Yasunori Iwasaki, Kitanagoya (JP); Takashi Yoshino, Ama (JP)

(73) Assignee: NGK INSULATORS, LTD., Aichi-Prefecture (JP)

( * ) Notice: Subject to any disclaimer, the term of this patent is extended or adjusted under 35 U.S.C. 154(b) by 0 days.

(21) Appl. No.: 14/969,809

(22) Filed: Dec. 15, 2015

(65) Prior Publication Data

US 2016/0108552 A1 Apr. 21, 2016

Related U.S. Application Data

(63) Continuation of application No. PCT/JP2014/069174, filed on Jul. 18, 2014.
(Continued)

(51) Int. Cl.
*C30B 19/02* (2006.01)
*C30B 9/12* (2006.01)
(Continued)

(52) U.S. Cl.
CPC ............ *C30B 19/02* (2013.01); *C30B 9/12* (2013.01); *C30B 19/12* (2013.01); *C30B 25/18* (2013.01); *C30B 25/186* (2013.01); *C30B 29/406* (2013.01); *H01L 21/0254* (2013.01); *H01L 21/0262* (2013.01); *H01L 21/02381* (2013.01); *H01L 21/02458* (2013.01);
(Continued)

(58) Field of Classification Search
CPC ......... C30B 9/12; C30B 29/38; H01L 21/208; H01L 21/20
See application file for complete search history.

(56) References Cited

U.S. PATENT DOCUMENTS

| 9,041,004 B2 | 5/2015 | Iwai et al. |
| 2002/0096106 A1 | 7/2002 | Kub et al. |

(Continued)

FOREIGN PATENT DOCUMENTS

| CN | 101410557 A | 4/2009 | |
| JP | 2007214256 A | * 8/2007 | ............. H01L 21/02 |

(Continued)

OTHER PUBLICATIONS

Japan Platform for Patent Information, English computer translation of JP 2007-290924A (2016).*
(Continued)

*Primary Examiner* — Matthew Song
(74) *Attorney, Agent, or Firm* — Cermak Nakajima & McGowan LLP; Tomoko Nakajima

(57) ABSTRACT

A composite substrate includes a polycrystalline ceramic substrate, a silicon substrate directly bonded to the polycrystalline ceramic substrate, a seed crystal film formed on the silicon substrate by vapor phase process and made of a nitride of a group 13 element, and a gallium nitride crystal layer grown on the seed crystal film by flux method.

5 Claims, 2 Drawing Sheets

Related U.S. Application Data

(60) Provisional application No. 61/856,797, filed on Jul. 22, 2013.

(51) Int. Cl.

| | | |
|---|---|---|
| *C30B 19/12* | (2006.01) | |
| *C30B 29/40* | (2006.01) | |
| *H01L 21/02* | (2006.01) | |
| *C30B 25/18* | (2006.01) | |
| *H01L 33/00* | (2010.01) | |
| *C30B 29/38* | (2006.01) | |
| *H01L 21/20* | (2006.01) | |
| *H01L 21/208* | (2006.01) | |

(52) U.S. Cl.
CPC .. *H01L 21/02645* (2013.01); *H01L 21/02658* (2013.01); *H01L 33/007* (2013.01); *C30B 29/38* (2013.01); *H01L 21/20* (2013.01); *H01L 21/208* (2013.01)

(56) References Cited

U.S. PATENT DOCUMENTS

| | | | | |
|---|---|---|---|---|
| 2002/0197830 A1* | 12/2002 | Watanabe | ............ | C23C 16/303 438/492 |
| 2003/0089950 A1* | 5/2003 | Kuech | ............... | H01L 21/76256 257/352 |
| 2006/0006500 A1* | 1/2006 | Piner | ....................... | C30B 25/02 257/613 |
| 2006/0145186 A1* | 7/2006 | Wallis | ...................... | C30B 23/02 257/190 |
| 2010/0301358 A1* | 12/2010 | Shibata | ..................... | C30B 9/10 257/98 |
| 2011/0274609 A1* | 11/2011 | Shimodaira | ............... | C30B 9/12 423/409 |
| 2012/0119224 A1 | 5/2012 | Tai et al. | | |

FOREIGN PATENT DOCUMENTS

| | | | |
|---|---|---|---|
| JP | 2007-290924 A | | 11/2007 |
| JP | 2007290924 A | * | 11/2007 |
| JP | 2012-124473 A | | 6/2012 |
| WO | WO2007/105832 A1 | | 9/2007 |
| WO | WO2010/084675 A1 | | 7/2010 |
| WO | WO2013/022122 A1 | | 8/2012 |

OTHER PUBLICATIONS

European Patent Office, English computer translation of JP 2007214256 (2016).*
International Preliminary Report on Patentability for PCT Patent App. No. PCT/JP2014/069174 (dated Jan. 26, 2016).
International Search Report and Written Opinion for PCT Patent App. No. PCT/JP2014/069174 (dated Oct. 21, 2014) with English language translation of the Search Report.
Ikeda, N., et al., "High power AlGaN/GaN HFET with a high breakdown voltage of over 1.8 kV on 4 inch Si substrates and the suppression of current collapse," Proceedings of the 20th International Symposium on Power Semiconductor Devices & IC's, May 18-22, 2008, Oralando, FL, pp. 287-290.
Office Action from Chinese Patent App. No. 201480034478.4 (dated May 18, 2016).

* cited by examiner

Fig. 1 ( b )

COMPOSITE SUBSTRATE, METHOD FOR FABRICATING SAME, FUNCTION ELEMENT, AND SEED CRYSTAL SUBSTRATE

TECHNICAL FIELD

The present invention relates to a method for manufacturing a composite substrate made of a nitride of a group 13 element, and an epitaxial wafer manufactured by this method and an electronic device.

BACKGROUND ART (Flux Method)

A flux method, which is one type of liquid-phase methods, can produce a gallium-nitride single crystal substrate having a low dislocation density. In the GaN single-crystal growth by the flux method, a seed crystal is generally used as a starting point to grow crystals of GaN. A substrate suitable for use in such growth is a wafer (seed crystal substrate) formed by growing a seed crystal layer of about 1 to 20 μm in thickness on a sapphire substrate by a vapor-phase method, such as a metal organic chemical vapor deposition (MOCVD) method and a hydride vapor phase epitaxy (HYPE) method (see Patent Document 1).

(MOCVD Method)

A metal organic chemical vapor deposition (MOCVD) method has been increasingly used to deposit a nitride semiconductor on a silicon substrate instead of the conventional sapphire substrate, thereby forming a power-device structure or a light-emitting diode (LED) element structure. The silicon substrate has a merit that a large-sized wafer for the silicon substrate is available.

(Composite Substrate)

In manufacturing semiconductor devices, such as a blue LED, a blue-violet semiconductor laser, and a power semiconductor, a composite substrate can be used that is formed by bonding an underlying substrate to a substrate formed from a group III nitride, such as gallium nitride (Patent Document 2).

In the power device or LED element using a gallium nitride thin film, generally, after a process for forming an element, to improve the heat dissipation properties, the silicon substrate or sapphire substrate is thinned by polishing and then bonded to an alumina substrate, an AlN polycrystalline substrate or the like having a higher thermal conductivity.

CITATION LIST

Non-Patent Document

Non-patent document 1: (GaN on Si by MOCVD method): "High power AlGaN/GaN HFET with a high breakdown voltage of over 1.8 kV on 4 inch Si substrates and the suppression of current collapse", Nariaki Ikeda, Syuusuke Kaya, Jiang Li, Yoshihiro Sato, Sadahiro Kato, Seikoh Yoshida, Proceedings of the 20th International Symposium on Power Semiconductor Devices & IC's May 18-22, 2008 Orlando, Fla.", pp. 287-290

Patent Document

Patent document 1: WO 2010/084675A1
Patent document 2: Japanese Unexamined Patent Application Publication No. 2012-124473A

SUMMARY OF THE INVENTION

In using the silicon substrate, particularly in applications for power devices, to achieve the high breakdown voltage device, it is necessary to form a complex multilayer structure by laminating films of GaN, AlGaN, AlN and the like, and then to deposit a thick GaN layer on the laminated films (see Non-patent Document 1). The GaN thin film formed on the silicon substrate by the MOCVD method makes it difficult to decrease dislocation density.

When intended to obtain the large-sized wafer by the flux method, a seed crystal substrate needs to be equal to or larger than the wafer size. Since the large-sized wafer for the silicon substrate is available easily and inexpensively, compared to the sapphire substrate, it is useful in terms of industry to form the GaN thin film on the silicon substrate by the MOCVD method, enabling production of a seed crystal substrate. However, the use of the seed crystal substrate including the silicon substrate generally makes it difficult to obtain a GaN single crystal by the flux method. This is because silicon tends to be dissolved in sodium used as the flux, so that the increase in silicon content in the flux drastically decreases the growth rate of GaN crystal, which hardly grows the GaN crystal. Actually, when the seed crystal substrate using the silicon substrate is employed to grow single crystals of GaN by the flux method, the silicon substrate will be completely dissolved into the flux, and furthermore, the growth of the GaN single crystal cannot be observed. Even if some measures can be taken to suppress the dissolution of silicon as much as possible, a small amount of silicon dissolved in the flux unintentionally generates impurities that are mixed in the GaN crystal. It is easily understood that the carrier concentration in the GaN single crystal is hard to control.

Solution to Problem

The present invention is characterized by the following:

(1) A method of manufacturing a composite substrate, said method comprising the steps of:
thinning a silicon substrate of a composite body, the composite body comprising a polycrystalline ceramic substrate and the silicon substrate directly bonded with each other;
depositing a seed crystal film comprising a nitride of a group 13 element on the silicon substrate by a gas-phase method; and
growing a gallium nitride crystal layer on the seed crystal film by a flux method.

(2) In the method (1), the nitride of the group 13 element is gallium nitride.

(3) In the method (1) or (2), the polycrystalline ceramic substrate comprises alumina or aluminum nitride.

(4) In any one of the methods (1) to (3), the silicon substrate is thinned to a thickness of not less than 0.2 μm nor more than 8 μm in the thinning step.

(5) A method for manufacturing a functional element includes the steps of:
thinning a silicon substrate of a composite body, the composite body comprising a polycrystalline ceramic substrate and the silicon substrate directly bonded with each other;

depositing a seed crystal film comprising a nitride of a group 13 element on the silicon substrate by a gas-phase method;

growing a gallium nitride crystal layer on the seed crystal film by a flux method; and forming a functional layer made of a nitride of a group 13 element on the gallium nitride crystal layer by a gas-phase method.

(6) In the method (5), the functional layer has a function of emitting light.

(7) In the method (5) or (6), the nitride of the group 13 element is gallium nitride.

(8) In any one of the methods (5) to (7), the polycrystalline ceramic substrate is formed of alumina or aluminum nitride.

(9) In any one of the methods (5) to (8), in the thinning step, the silicon substrate is thinned to a thickness of not less than 0.2 µm nor more than 8 µm.

(10) A method for manufacturing a seed crystal substrate includes the steps of:

thinning a silicon substrate of a composite body, the composite body comprising a polycrystalline ceramic substrate and the silicon substrate directly bonded with each other; and depositing a seed crystal film made of a nitride of a group 13 element on the silicon substrate by a gas-phase method.

(11) In the method (10), the nitride of the group 13 element is gallium nitride.

(12) In the method (10) or (11), the polycrystalline ceramic substrate is formed of alumina or aluminum nitride.

(13) In any one of the methods (10) to (12), the silicon substrate is thinned to a thickness of not less than 0.2 µm nor more than 8 µm.

Advantageous Effects of Invention

The underlying substrate is used that is formed by bonding the polycrystalline ceramic substrate made of alumina or AlN directly to the silicon substrate and making these substrates composite. Preferably, after thinning the silicon substrate, the seed crystal film made of a nitride of a group 13 element is deposited on the silicon surface by the gas-phase method (particularly, MOCVD method). This substrate is used as the seed crystal substrate, to which the flux method is applied. In this way, the GaN layer having good crystallinity is deposited thickly on the GaN thin film by the liquid-phase method without bringing the flux into contact with silicon that would otherwise inhibit the crystal growth in applying the flux method, thereby enabling manufacture of the GaN template substrate (composite substrate).

The complexation of the silicon substrate and the polycrystalline ceramic substrate has the advantage that it can suppress the warpage and cracks from occurring because of the stress generated during growth of the thick film made of the nitride of the group 13 element. Thus, even when the thick GaN layer needs to be formed to manufacture the high breakdown-voltage power device over the silicon substrate by the MOCVD method, a complicated multilayer stress-release layer can be drastically simplified or abolished, which enables improvement of the productivity.

As mentioned above, the GaN template substrate with good crystallinity can be obtained using the seed crystal substrate in which the gallium nitride is grown over the underlying substrate including complexation of the inexpensive, large-sized silicon substrate and the polycrystalline ceramic substrate. As a result, the performance of the LED or power device can be enhanced to further improve the heat dissipation properties without employing the expensive single crystal SiC normally used.

Further, the seed crystal film is provided over the silicon of the underlying substrate formed by complexation of the silicon substrate and the polycrystalline ceramic substrate, whereby both main surfaces of the silicon substrate are covered with either of the polycrystalline ceramic and the seed crystal film, which can suppress the dissolution of the silicon substrate in the melt during the crystal growth by the flux method. When the silicon substrate is subjected to the thinning process, the effect of preventing the dissolution is further enhanced.

In particular, when the silicon substrate is thinned, the contact of the silicon substrate with the melt can be minimized without the necessity of covering the side surfaces of the silicon substrate, enabling reduction in manufacturing cost.

BRIEF DESCRIPTION OF DRAWINGS

FIG. 1(b) is a schematic diagram showing an underlying substrate 7.

DESCRIPTION OF EMBODIMENTS

Figure 1A:
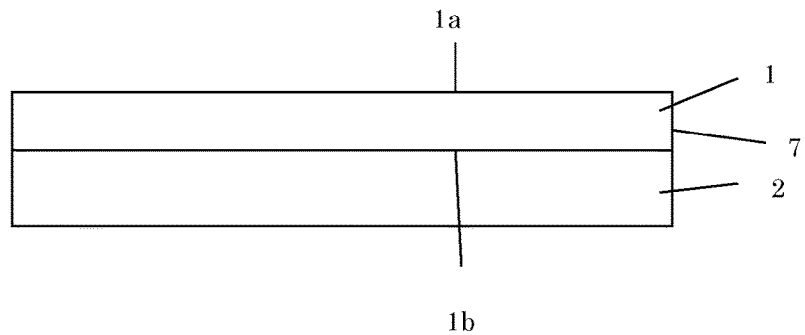
FIG. 1(a) is a schematic diagram showing the state of a silicon substrate 1 formed on a polycrystalline ceramic substrate.
Figure 1A:
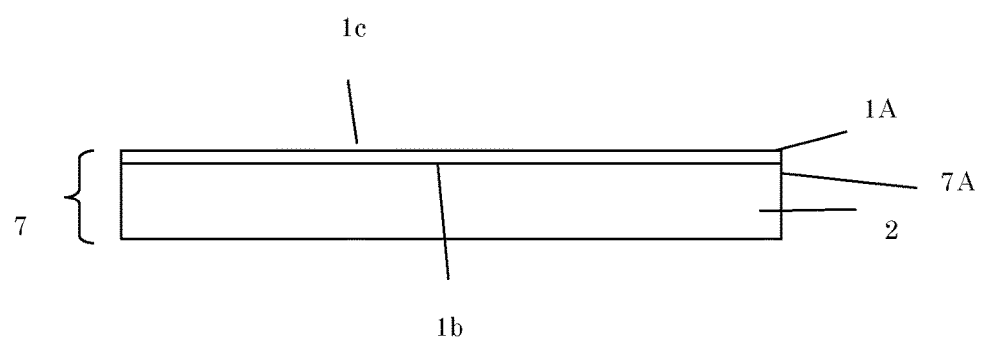

As shown in FIG. 1(a), a silicon substrate 1 is directly bonded to a polycrystalline ceramic substrate 2. Reference character 1b denotes a bonded surface of the silicon substrate to the polycrystalline ceramic substrate; reference character 1a denotes an exposed main surface; and reference character 7 denotes an exposed side surface. Then, as shown in FIG. 1(b), the silicon substrate 1 is subjected to a thinning process to thereby form a thinned silicon substrate 1A. Reference character 1c denotes a processed surface of the thinned silicon substrate. Reference character 7A denotes an exposed side surface. This silicon substrate 1A and the polycrystalline ceramic substrate 2 form an underlying substrate 7.

Figure 1C:
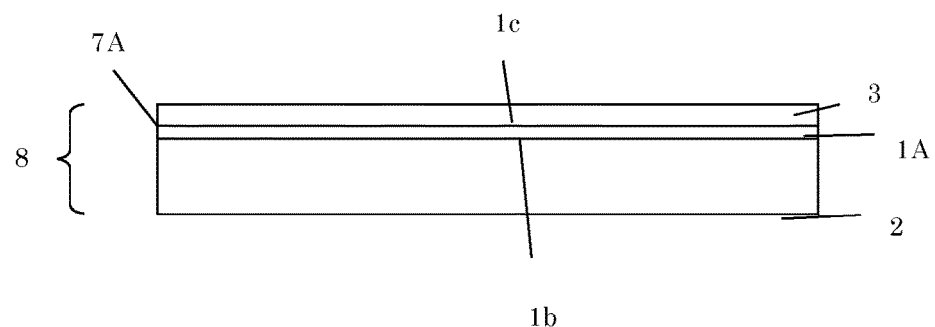
FIG. 1(c) is a schematic diagram showing a seed crystal substrate 8.

Then, as shown in FIG. 1(c), a seed crystal film 3 is formed over the processed surface 1c of the silicon substrate 1A, thereby forming a seed crystal substrate 8.

Figure 2A:
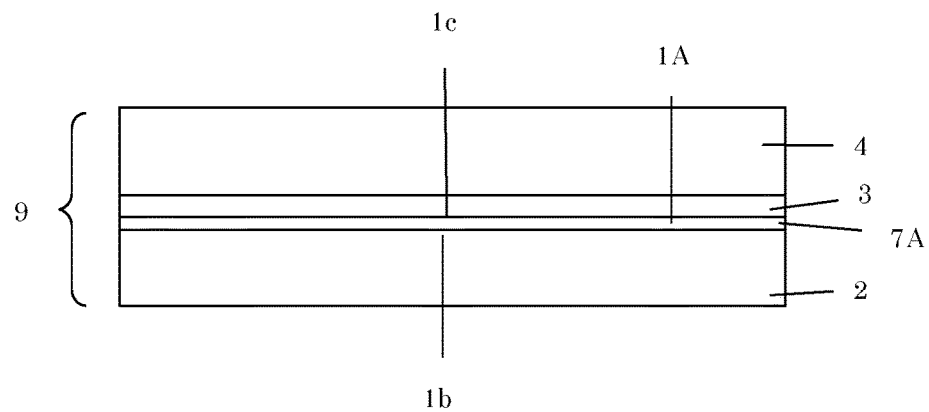
FIG. 2(a) is a schematic diagram showing a composite substrate 9.
Figure 2B:
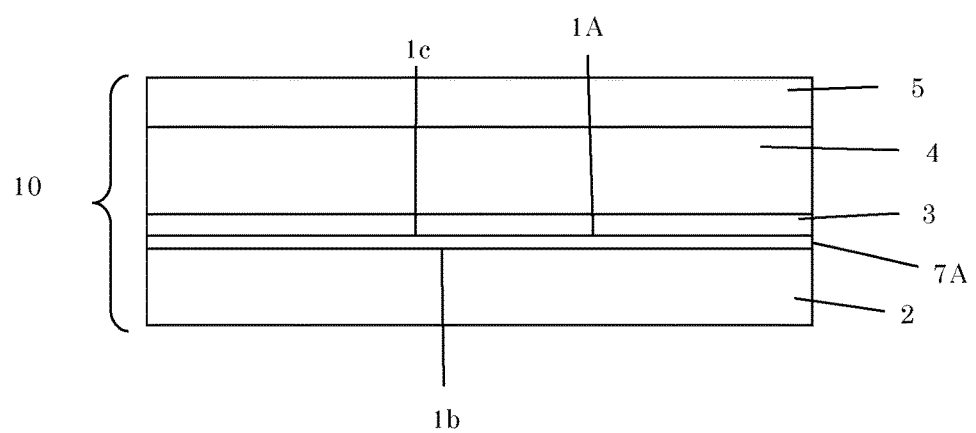
FIG. 2(b) is a schematic diagram showing a light-emitting element 10.

Then, as shown in FIG. 2(a), a gallium nitride crystal layer 4 is formed over the seed crystal film 3 by the flux method, thereby producing a GaN template substrate (composite substrate) 9. Then, a light-emitting element structure 5 is formed over the GaN template substrate 9 as needed, thus producing a functional element 10 (see FIG. 2(b)).

Suitable materials for the polycrystalline ceramic substrate 2 can include alumina, aluminum nitride, and the like.

In a method for bonding the polycrystalline ceramic substrate to the silicon substrate, for example, the polycrystalline ceramic substrate and the silicon substrate can be directly bonded together by polishing both substrates, irradiating these substrates with argon beams, and applying a load to the substrates with the polished surfaces thereof in contact with each other under vacuum.

The silicon substrate is preferably subjected to the thinning process to decrease its thickness, for example, to 8 µm or less. The thinning process is preferably a polishing process. The thinned silicon substrate preferably has a thickness of 8 µm or less, and more preferably 3 µm or less.

By thinning the silicon substrate in this way, the side surfaces of the silicon substrate are significantly suppressed from being dissolved in a melt.

In terms of workability of the thinning process, the thinned silicon substrate normally has a thickness of 0.2 μm or more, and preferably 0.5 μm or more.

Even if the silicon substrate is not subjected to the thinning process, the silicon substrate is initially made as thin as possible in a stage where it is bonded to the polycrystalline ceramic substrate, which can suppress the contact of the side surfaces of the silicon substrate with the melt. In such a case, the thickness of the silicon substrate is also preferably 30 μm or less.

When forming the seed crystal film on the silicon substrate, the side surfaces of the silicon substrate can be coated with the seed crystal film to prevent the exposure of the silicon substrate to the outside.

The seed crystal film is formed of a nitride of a group 13 element on the silicon substrate by the gas-phase method.

The seed crystal film may be a single layer, or otherwise may include a buffer layer on a side of the underlying substrate. One preferable example of a method for forming the seed crystal film can be a vapor-phase growth method. Specifically, examples of the vapor-phase growth methods can include a metal organic chemical vapor deposition (MOCVD) method, a hydride vapor phase epitaxy (HVPE) method, a pulse excited deposition (PXD) method, an MBE method and a sublimation method. Among them, the MOCVD method is particularly preferred.

The group 13 element means any group 13 element according to the Periodic Table determined by IUPAC. Specifically, the group 13 elements include gallium, aluminum, indium, thallium, etc. Further, suitable additives can include carbon, a low melting point metal (tin, bismuth, silver, gold), and a high melting point metal (a transition metal such as iron, manganese, titanium, and chromium). The low melting point metal may be added for preventing oxidation of sodium, while the high melting point metal may be mixed from a container for containing a crucible, a heater of a growing furnace, or the like in some cases. Preferable nitrides of the group 13 elements include GaN, AlN, GaAlN, GaInN, AlInN, and GaAlInN.

Then, the gallium nitride crystal layer is formed over the seed crystal film by the flux method. At this time, the kind of the flux is not specifically limited as long as it can generate the gallium nitride crystals. Preferred embodiments use a flux containing at least one of alkali metal and alkaline earth metal, particularly preferably a flux containing sodium.

Into the flux, gallium material is mixed and then used. As the gallium material, a gallium simple substance, a gallium alloy, and a gallium compound can be used. In terms of handling, the gallium simple substance is preferably used.

The growth temperature of the gallium nitride crystal by the flux method and the holding time during the crystal growth thereof are not specifically limited, and changed in accordance with a composition of the flux as appropriate. As one example, when the gallium nitride crystal is grown using a flux containing sodium or lithium, the growth temperature may be preferably set at 800 to 950° C., and more preferably at 850 to 900° C.

In the flux method, a single crystal is grown under an atmosphere including a gas containing nitrogen atoms. This gas is preferably nitrogen gas, or alternatively may be ammonia. The pressure of the atmosphere is not specifically limited, but it may be preferably set at 10 atm or more, and further preferably 30 atm or more, from the standpoint of prevention against the evaporation of the flux. However, under a high pressure, an apparatus will have to be larger. Therefore, the total pressure of the atmosphere may be preferably set at 2000 atm or less, and further preferably 500 atm or less. Gas in the atmosphere, other than gas containing nitrogen atoms, is not limited; but an inert gas is preferably used, and especially, argon, helium, or neon is more preferably used.

A functional layer is formed by the gas-phase method on the composite substrate obtained in this way. When a light-emitting diode (LED) is fabricated on the composite substrate by the gas-phase method, preferably, the MOCVD method, the dislocation density inside the LED is substantially on the same level as the GaN single crystal of the GaN template, which can achieve the high luminance while suppressing a droop phenomenon.

The film-forming temperature for the functional layer is preferably 1000° C. or higher and more preferably 1050° C. or higher, in terms of the quality of the crystals. Further, from the viewpoint of preventing degradation in the crystal quality of the gallium nitride crystal layer, the film-forming temperature of the functional layer may preferably be 1200° C. or lower and more preferably be 1150° C. or lower.

Preferable material for the functional layer is a nitride of a group 13 element. The group 13 element means any group 13 element according to the Periodic Table defined by IUPAC. Specifically, the group 13 elements include gallium, aluminum, indium, thallium, etc. Further, suitable additives can include carbon, transition metals (iron, manganese, titanium, chromium, etc.)

The light-emitting element structure includes, for example, an n-type semiconductor layer, a light emission region provided over the n-type semiconductor layer, and a p-type semiconductor layer provided over the light emission region. For example, an n-type contact layer, an n-type clad layer, an active layer, a p-type clad layer and a p-type contact layer are formed over the gallium nitride crystal layer, thereby producing the light-emitting element structure.

The invention can be applied to technical fields requiring high quality, for example, a high-luminance white LED with high color rendering properties, a blue-violet laser for a high-speed and high-density optical disk, a power device used in an inverter for hybrid vehicles, and the like.

EXAMPLES (Complexation of Substrates)

A polycrystalline ceramic substrate 2 having a diameter of 4 inches and a thickness of 500 μm and made of aluminum nitride was prepared and then polished using diamond abrasive grains to be planarized. The polished surface in a region of 10 μm square was observed with an atomic force microscope (AFM) to measure the surface roughness thereof. As a result, a root-mean-square surface roughness of the polished surface was 0.8 nm.

This polished polycrystalline ceramic substrate 2 made of aluminum nitride and the silicon substrate 1 of a (111) plane were put in a vacuum chamber. Here, the silicon substrate 1 had a diameter of 4 inches and a thickness of 300 μm, and had both surfaces thereof polished. Then, the polished surfaces of both substrates were irradiated with argon beams in vacuum for three minutes. Thereafter, the surfaces irradiated with the beams were brought into contact with each other in the vacuum chamber and bonded together by applying a load of one ton thereto at room temperature, thereby producing a composite wafer.

A silicon surface of the composite wafer 7 was polished with the diamond abrasive grains. The silicon substrate of the composite wafer was polished to be thinned to a thickness of 5 μm. Then, the composite wafer had its outer peripheral surface chamfered by a beveling process. Specifically, tapering was performed by the beveling process in such a manner that the silicon surface was positioned inside the outer periphery of the polycrystalline ceramic substrate by 0.5 mm. The polished silicon surface in a region of 10 μm square was observed with the AFM to measure the surface roughness thereof. As a result, a root-mean-square surface roughness of the silicon surface was 0.1 nm or less.

(Production of Seed Crystal Substrate)

A surface oxide film was removed from the underlying substrate 7 by cleaning with dilute hydrofluoric acid having a composition of the ratio of hydrofluoric acid to pure water of 1 to 10 (1/10) (by volume ratio), and then the cleaned underlying substrate was set on a susceptor in a reactor of an MOCVD system. At this time, the side of the polycrystalline ceramic substrate 2 was placed to be in contact with the susceptor to deposit a film at the silicon surface. Then, the inside of the reactor was set under a mixing atmosphere of hydrogen and nitrogen, and the substrate was heated up to 1050° C., which was an initial layer formation temperature.

The internal pressure of the reactor was set to 10 kPa, and a trimethyl aluminum (TMA) bubbling gas was introduced into the reactor at a predetermined flow rate ratio, whereby $NH_3$ and TMA reacted with each other to form an AlN film in a thickness of 100 nm. Thereafter, $NH_3$, TMA, and TMG reacted with each other to form an AlGaN film in a thickness of 40 nm.

Then, while keeping the substrate temperature constant, trimethyl gallium (TMG) and ammonia were used as materials to grow a GaN film 3 up to a thickness of 3 μm. Thereafter, the substrate temperature was reduced to room temperature, and a composite wafer was taken out.

(Flux Method)

A GaN crystal layer 4 was grown by the flux method, using the composite wafer as the seed crystal substrate 8. Materials used for the growth include gallium, sodium, and lithium. The seed crystal substrate was placed in an alumina crucible such that the flux came into contact with the GaN film deposited by the MOCVD method. Into the crucible, 30 g of gallium, 44 g of sodium, and 30 mg of lithium were charged, whereby GaN single crystals were grown in a furnace at a temperature of 900° C. and a pressure of 5 MPa for about 10 hours. After taking out the seed crystal substrate 8 from the crucible, the GaN single crystal was deposited at the surface of the substrate in a thickness of about 100 μm.

The surface of the thus-obtained composite substrate where the GaN single crystals were grown were planarized by polishing with the diamond abrasive grains, whereby the composite substrate 9 with the transparent gallium nitride single crystal film attached thereto was obtained. The gallium nitride single crystal film has 4 inches in diameter without any cracks.

The dislocation density of the gallium nitride single crystal film was calculated by measuring dark spots (spots that looked dark compare to their surroundings because of the weak emission) appearing as dislocations on the substrate surface by a cathode luminescence (CL) method. For the measurement by the CL method, a device equipped with a cathode luminescence detector, marketed under the "S-3400N Type II" trade name, manufactured by Hitachi High-Technologies Corporation was used. As a result, the dislocation density of each substrate surface was approximately $7 \times 10^6$ $cm^{-2}$.

(Production of Light-emitting Element Structure)

A light-emitting element structure 5 was deposited on the thus-obtained composite substrate 9 including the gallium nitride single crystals and having a diameter of 4 inches.

The composite substrate 9 was put again into the MOCVD furnace, and a substrate temperature was increased to 1100° C. in the mixing atmosphere including hydrogen and nitrogen. Then, an n-type GaN film was grown to a thickness of 1 μm, using the TMG (trimethyl gallium) and ammonia as materials, as well as silane gas as a dopant.

Next, the substrate temperature was decreased to 750° C. and three pairs of InGaN/GaN quantum well structures were formed. Subsequently, the substrate temperature was elevated to 1050° C. and a p-type GaN film was grown to a thickness of 0.1 μm, by using the TMG (trimethyl gallium) and ammonia as materials as well as Cp2Mg as a dopant.

Comparative Examples 1 and 2

A silicon substrate 1 with (111) plane that had a diameter of 4 inches and a thickness of 300 μm was used, without performing the thinning, polishing process. A seed crystal film 3 was directly formed on the silicon substrate 1 (in Comparative Example 1). A (111) plane-oriented silicon substrate having a diameter of 4 inches and a thickness of 500 μm was used as the silicon substrate 1, but the polycrystalline ceramic substrate 2 was not used. Thus, the complexation of the substrate itself was not done (in Comparative Example 2). In these comparative examples, except for the above points, composite substrates were fabricated in the same way as that of the above-mentioned examples.

As a result, in both of Comparative Examples 1 and 2, the silicon substrate 1 and the GaN seed crystal film 3 disappeared in a GaN crystal growth step by the flux method. This is considered to be because the silicon substrate 1 and GaN seed crystal film 3 were dissolved in the flux. Thus, the composite substrate 9 was not obtained.

The invention claimed is:

1. A method of manufacturing a functional element, said method comprising the steps of:
    thinning a silicon body of a composite body to provide a silicon film having a thickness of greater than 0.2 μm but not more than 8.0 μm, said composite body comprising a polycrystalline ceramic substrate and said silicon substrate directly bonded with each other;
    chamfering an outer peripheral surface of said composite body by a beveling process, a surface of said silicon film being positioned inside of said outer peripheral surface of said polycrystalline ceramic body after said beveling process;
    depositing a seed crystal film comprising a nitride of a group 13 element on said silicon film by a gas-phase method to cover said silicon film by said seed crystal film;
    growing a gallium nitride crystal layer on said seed crystal film by a flux method in a in a melt in a crucible, said melt comprising a gallium raw material and at least one element selected from the group consisting of an alkali metal and an alkaline earth metal, while said seed crystal film preventing contact of said silicon film and said melt and thereby preventing dissolution of silicon from a side surface of said silicon film into said melt;
    removing said composite substrate from said crucible, said composite substrate comprising said polycrystalline ceramic substrate, said silicon film, said seed crystal substrate, and said gallium nitride crystal layer; and forming a functional layer comprising a nitride of a group 13 element on said gallium nitride crystal layer by a gas-phase method to provide said functional element comprising said polycrystalline ceramic substrate, said silicon film, said seed crystal substrate, said gallium nitride crystal layer and said functional layer.

2. The method of claim 1, wherein said functional layer has a function of emitting light.

3. The method of claim 1, wherein said nitride of said group 13 element comprises gallium nitride.

4. The method of claim 1, wherein said polycrystalline ceramic substrate comprises alumina or aluminum nitride.

5. The method of claim 1, wherein said silicon film has a thickness of 0.5 µm or larger but not more than 8.0 µm.

* * * * *